United States Patent
Kim (10) Patent No.: US 10,739,815 B2
(45) Date of Patent: *Aug. 11, 2020

(54) DISPLAY DEVICE

(71) Applicant: Samsung Display Co., Ltd., Yongin-si, Gyeonggi-do (KR)

(72) Inventor: Min Soo Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/538,521

(22) Filed: Aug. 12, 2019

(65) Prior Publication Data

US 2019/0361493 A1 Nov. 28, 2019

Related U.S. Application Data

(63) Continuation of application No. 15/673,133, filed on Aug. 9, 2017, now Pat. No. 10,379,574.

(30) Foreign Application Priority Data

Sep. 23, 2016 (KR) ........................ 10-2016-0122298

(51) Int. Cl.
| | | |
|---|---|---|
| *G06F 1/16* | (2006.01) | |
| *H01L 27/32* | (2006.01) | |
| *H01L 51/10* | (2006.01) | |
| *H01L 51/00* | (2006.01) | |
| *G02F 1/1333* | (2006.01) | |

(52) U.S. Cl.
CPC .......... *G06F 1/1616* (2013.01); *H01L 27/323* (2013.01); *H01L 51/107* (2013.01); *G02F 1/13338* (2013.01); *H01L 27/3279* (2013.01); *H01L 51/0097* (2013.01); *H01L 2251/5338* (2013.01)

(58) Field of Classification Search
CPC . G02F 1/13338; H01L 51/107; H01L 27/323; H01L 27/3279; G06F 1/1616
See application file for complete search history.

(56) References Cited

U.S. PATENT DOCUMENTS

| | | | |
|---|---|---|---|
| 9,246,486 B2 | 1/2016 | Yang et al. | |
| 10,379,574 B2* | 8/2019 | Kim | ................... G06F 1/1616 |
| 2011/0115729 A1 | 5/2011 | Kremin et al. | |
| 2013/0009905 A1 | 1/2013 | Castillo et al. | |
| 2015/0144920 A1 | 5/2015 | Yamazaki et al. | |
| 2015/0253883 A1* | 9/2015 | Takano | ................. G06F 3/0485 345/173 |
| 2015/0331496 A1* | 11/2015 | Kwak | ................... G06F 3/0487 345/156 |
| 2016/0064466 A1 | 3/2016 | Son et al. | |
| 2017/0052566 A1 | 2/2017 | Ka et al. | |
| 2018/0088716 A1 | 3/2018 | Kim | |
| 2018/0059718 A1 | 5/2018 | Ramaswamy et al. | |
| 2019/0317641 A1* | 10/2019 | Maruyama | ................ G01L 5/00 |

FOREIGN PATENT DOCUMENTS

KR 10-2018-0033353 A 4/2018

* cited by examiner

*Primary Examiner* — Abbas I Abdulselam
(74) *Attorney, Agent, or Firm* — Innovation Counsel LLP (57) ABSTRACT

A display device includes a display panel configured to be bent or unbent, a first sensor disposed on a first surface of the display panel and configured to sense a bending direction and a deformation rate of the display device, and a second sensor disposed on a second surface of the display panel and configured to sense the bending direction and the deformation rate of the display device.

16 Claims, 8 Drawing Sheets

DISPLAY DEVICE

CROSS-REFERENCE TO RELATED APPLICATION

This application is a continuation application of U.S. patent application Ser. No. 15/673,133 filed on Aug. 9, 2017, which claims priority to Korean Patent Application No. 10-2016-0122298, filed on Sep. 23, 2016, in the Korean Intellectual Property Office (KIPO), and all the benefits accruing therefrom under 35 U.S.C. § 119, the contents of the prior applications being herein incorporated by reference.

BACKGROUND

Field

Embodiments of the present disclosure relate to a display device.

Description of the Related Art

As interest in information displays has increased, and demand for portable information media has increased, research on and commercialization of display devices have been focused.

A recent display device includes a touch sensor for receiving a touch input from a user in addition to displaying an image. Accordingly, the user may use a display device more conveniently through the touch sensor.

In addition, recently, various attempts have been made to provide various functions to the user by using a pressure caused by a touch, or a flexible characteristic of the display device in addition to a position of the touch.

SUMMARY

According to an aspect of the present disclosure, there is provided a display device including a touch sensor detecting a touch position, an intensity of a touch, and a bending direction and a bending angle of the display device.

According to an embodiment of the present disclosure, a display device may include a display panel configured to be bent or unbent, a first sensor disposed on a first surface of the display panel and configured to sense a bending direction and a deformation rate of the display device, and a second sensor disposed on a second surface of the display panel and configured to sense the bending direction and the deformation rate of the display device.

The display panel may include a neutral plane having a minimum deformation rate in a bending area when the display device is bent.

The neutral plane may be interposed between the first sensor and the second sensor.

The display device may further include a sensor controller configured to detect the bending direction and the deformation rate of the display device by using sensing signals output from the first sensor and the second sensor.

Each of the first sensor and the second sensor may include a plurality of electrodes for sensing a touch by using a capacitance sensing method.

At least one of the plurality of electrodes may include a resistive element that is at least partially bent.

A resistance of the resistive element may be changed in response to a pressure of the touch or bending of the display device.

The sensor controller may detect the bending direction and the deformation rate of the display device with reference to a resistance variation of the resistive element reflected in an output signal of the first sensor and a resistance variation of the resistive element reflected in an output signal of the second sensor.

The sensor controller may detect the bending direction of the display device by determining whether or not the resistance variations reflected in the output signals of the first sensor and the second sensor are caused by a tensile stress or a compressive stress.

The sensor controller may detect the deformation rate with reference to a level of the resistance variation.

The sensor controller may detect a position of the touch from a capacitance variation reflected in an output signal of the first sensor or the second sensor, and detect a pressure of the touch from a resistance variation of the resistive element reflected in the output signal of the first sensor or the second sensor.

Each of the first sensor and the second sensor may include a plurality of first electrodes arranged in a first direction, a plurality of second electrodes arranged in a second direction perpendicular to the first direction and configured to form a mutual-capacitance with an adjacent first electrode, a plurality of first connection units connecting the plurality of first electrodes to one another, and a plurality of second connection units connecting the plurality of second electrodes to one another.

At least one of the plurality of first connection units or the plurality of second connection units may include a resistive element having a zig-zag pattern.

At least one of the plurality of first connection units or the plurality of second connection units may include a resistive element that is at least partially bent.

In a bending area of the display device, a compressive stress may be applied to the second sensor in response to a tensile stress applied to the first sensor, and a tensile stress may be applied to the second sensor in response to a compressive stress applied to the first sensor.

The display device may further include a first adhesive layer disposed between the first sensor and the display panel, and a second adhesive layer disposed between the display panel and the second sensor.

The display device may further include a window disposed above the first sensor.

The display device may further include a lower protective layer disposed under the second sensor.

DETAILED DESCRIPTION

The details of other embodiments are included in the detailed description and the drawings.

The advantages and features of the present disclosure, and how to accomplish them, will be described with reference to the embodiments described below in detail with reference to the accompanying drawings. However, the present disclosure is not limited to the embodiments described herein but may be embodied in other forms. It is also noted that in this specification, "coupled/coupled" refers to one component directly coupling another component and also indirectly coupling another component through an intermediate component. In addition, in the drawings, the same or similar constituent elements are denoted by the same reference numerals and marks, where applicable, throughout the different drawings.

In the present specification, for convenience of explanation, a direction in which an image is displayed is referred to as an 'upper direction' or a 'front direction', and an opposite direction thereof is referred to as a 'lower direction' or a 'rear direction'.

Hereinafter, a display device according to an embodiment of the present disclosure will be described with reference to drawings related to embodiments of the present disclosure.

Figure 1:
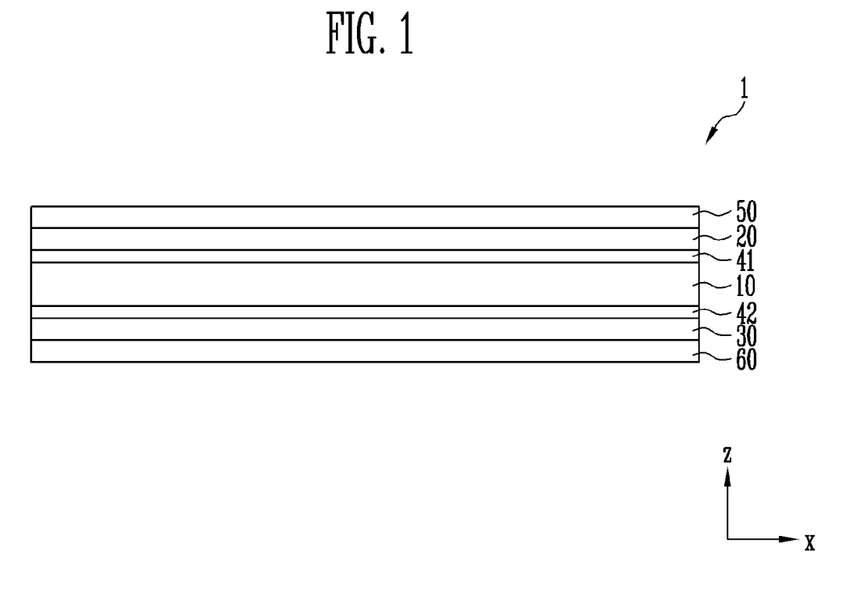
FIG. 1 is a cross-sectional view schematically illustrating a display device according to an embodiment of the present disclosure.

FIG. 1 is a cross-sectional view schematically illustrating a display device according to an embodiment of the present disclosure.

Referring to FIG. 1, a display device 1 according to an embodiment of the present disclosure may include a display panel 10, a first sensor 20, and a second sensor 30.

The display panel 10 may display an image and be disposed between the first sensor 20 and the second sensor 30.

The first sensor 20 may be disposed above the display panel 10 and sense a position and an intensity of a touch input to a window 50. In addition, the first sensor 20 may sense a bending direction and a bending angle of the display device 1 when the display device 1 is bent.

The first sensor 20 may include electrodes (not shown) sensing a capacitance variation caused by a touch or a resistance variation caused by a force applied to the display device 1.

The first sensor 20 and the display panel 10 may be attached to each other by a first adhesive layer 41. The first adhesive layer 41 may be formed of a transparent adhesive material having a high light transmittance, such as a pressure sensitive adhesive (PSA), an optically clear adhesive (OCA), an optically clear resin (OCR), and the like.

The second sensor 30 may be disposed under the display panel 10 and sense a position and an intensity of a touch input to a lower protective layer 60. In addition, the second sensor 30 may sense the bending direction and the bending angle of the display device 1 when the display device 1 is bent.

The second sensor 30 may include electrodes (not shown) sensing the capacitance variation caused by the touch or the resistance variation caused by the force applied to the display device 1. Specifically, the second sensor 30 may have the same configuration as the first sensor 20.

The second sensor 30 and the display panel 10 may be attached to each other by a second adhesive layer 42.

The display device 1 according to an embodiment of the present disclosure may further include the window 50 disposed above the first sensor 20 (a z-axis direction).

The window 50 may be disposed at an outermost portion of the display device 1 to receive a user's touch and protect constituents forming the display device 1.

The window 50 may be a transparent and flexible film for transmitting an image emitted from the display panel 10, but the present disclosure is not limited thereto.

Although not shown in FIG. 1, a polarizing plate may be disposed below the window 50 in some embodiments.

The display device 1 according to an embodiment of the present disclosure may further include the lower protective layer 60 disposed under the second sensor 30 (the z-axis direction).

The lower protective layer 60 may be a polyimide (PI) film, but the present disclosure is not limited thereto. Examples of the materials forming the lower protective layer 60 may include polyethyleneterephthalate (PET), polycarbonate (PC), polymethylmethacrylate (PMMA), polyethylenenaphthalate (PEN), polyethersulfone (PES), a cyclic olefin polymer (COC), a triacetylcelluose (TAC) film, a polyvinyl alcohol (PVA) film, polystyrene (PS), or biaxially oriented PS (BOPS) containing K resin.

The display device 1 according to an embodiment of the present disclosure may be flexible, stretchable, foldable, bendable, or rollable.

Thus, the display panel 10, the first sensor 20, the second sensor 30, the first and second adhesive layers 41 and 42, the window 50, and the lower protective layer 60 forming the display device 1 may also be flexible, stretchable, foldable, bendable, or rollable.

Figure 2:
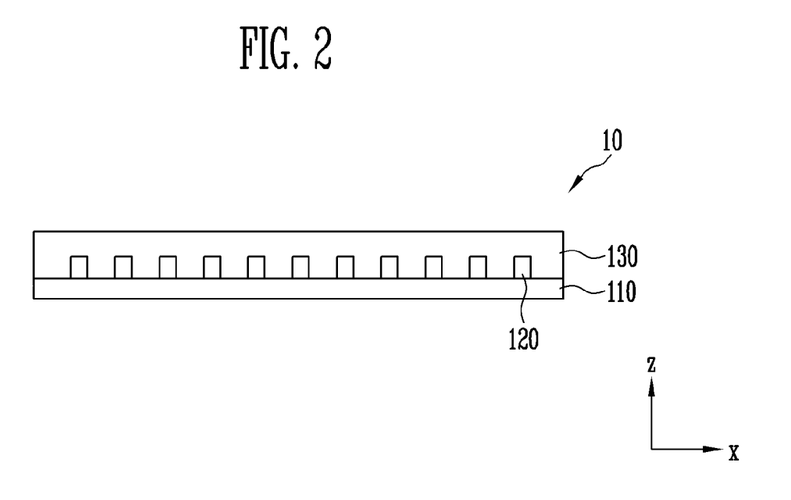
FIG. 2 is a view illustrating a display panel according to an embodiment of the present disclosure.

FIG. 2 is a view illustrating a display panel according to an embodiment of the present disclosure.

Referring to FIG. 2, the display panel 10 according to an embodiment of the present disclosure may include a substrate 110, pixels 120, and an encapsulation layer 130.

A plurality of pixels 120 may be disposed on the substrate 110. In addition, the encapsulation layer 130 may be disposed on the pixels 120 and the substrate 110.

For example, the substrate 110 may be made of an insulating material such as glass, resin, or the like. Further, the substrate 110 may be made of a material having flexibility so as to be bendable or foldable, and may have a single layer structure or a multi-layer structure.

For example, the substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and the like.

However, the material forming the substrate 110 may be variously changed, and the substrate 100 may be made of fiber glass reinforced plastic (FRP), or the like.

The pixels 120 may emit light in response to control of a display driver (not shown) and be protected by the encapsulation layer 130.

For example, the encapsulation layer 130 may prevent the pixels 120 from being penetrated by moisture, oxygen, and the like.

The encapsulation layer 130 may include at least one of glass, an organic material, and an inorganic material and have a single layer structure or a multi-layer structure.

For example, the encapsulation layer 130 may have a multi-layer structure including at least one organic film and at least one inorganic film.

Examples of the materials forming the organic film may include an organic insulating material, for example, polyacrylic, polyimide, a fluorocarbon compound such as Teflon, polyepoxy, benzocyclobutene, and the like. Examples of the materials forming the inorganic film may include an inorganic insulating material such as polysiloxane, a silicon nitride, a silicon oxide, a metal oxide including an aluminum oxide, and the like.

Figure 3:
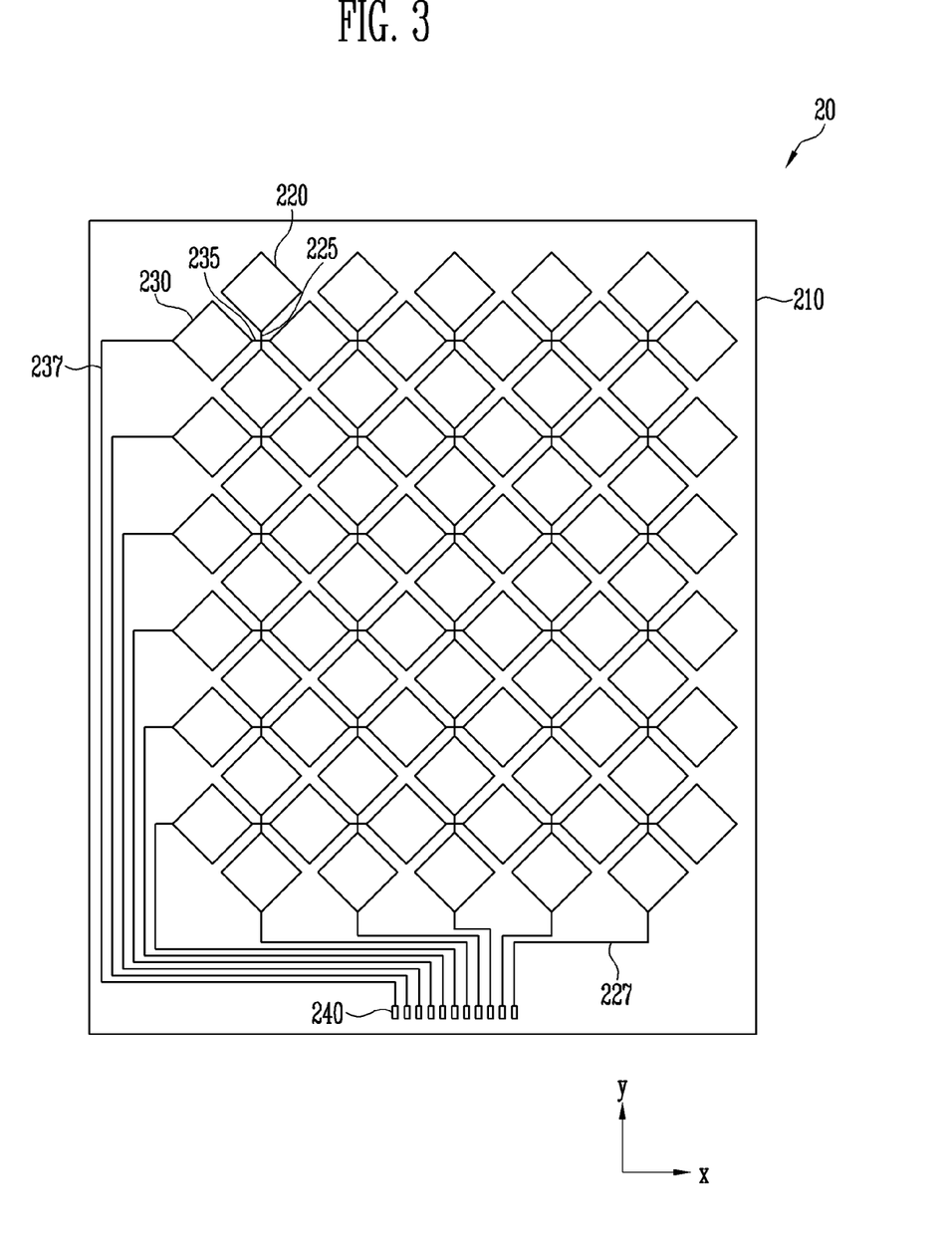
FIG. 3 is a plan view illustrating a first sensor according to an embodiment of the present disclosure.

FIG. 3 is a plan view illustrating a first sensor according to an embodiment of the present disclosure.

Referring to FIG. 3, the first sensor 20 according to an embodiment of the present disclosure may include a substrate 210, a plurality of first electrodes 220, a plurality of second electrodes 230, a plurality of first wires 227, a plurality of second wires 237, and a plurality of pads 240.

First, the substrate 210 may be made of an insulating material such as glass, resin, or the like. Further, the substrate 210 may be made of a material having flexibility so as to be bendable or foldable, and may have a single-layer structure or a multi-layer structure.

For example, the substrate 210 may include one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and the like.

The plurality of first electrodes 220 and the plurality of second electrodes 230 may be disposed on the substrate 210.

The first and second electrodes 220 and 230 may have a lozenge shape or a diamond shape.

The first electrodes 220 may be electrically connected to one another along a first direction (a y-axis direction) through a first connection unit 225, and the second electrodes 230 may be electrically connected to one another along a second direction (an x-axis direction) through a second connection unit 235.

The first electrodes 220 and the second electrodes 230 may be disposed on different layers or on the same layer.

An area between the first electrodes 220 may be filled with the second electrodes 230. When the first electrodes 220 and the second electrodes 230 are disposed on the same layer, a predetermined insulating material may be formed at an intersection between the first connection unit 225 and the second connection unit 235 to electrically isolate the first electrodes 220 and the second electrodes 230 (a bridge structure).

The first and second electrodes 220 and 230 according to an embodiment of the present disclosure may be used for sensing a touch input to the window 50 according to a capacitance variation sensing technique. More specifically, the first and second electrodes 220 and 230 may be used for sensing a mutual-capacitance.

More specifically, a mutual-capacitance between the first electrodes 220 and the second electrodes 230 may be formed by an arrangement of the first electrodes 220 and the second electrodes 230, and when a touch is input to the window 50, the mutual-capacitance of the first and second electrodes 220 and 230 in association with the touch may be changed.

The first electrodes 220 and the second electrodes 230 may include a conductive material. For example, the conductive material may be metals, an alloy thereof, a conductive polymer, a conductive metal oxide, or the like.

According to an embodiment of the present disclosure, examples of the metals may include copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead and the like. Examples of the conductive polymer may include polythiophene-based, polypyrrole-based, polyaniline-based, polyacetylene-based, and polyphenylene-based compounds, and a mixture thereof. More specifically, a PEDOT/PSS compound may be used among the polythiophene-based compounds.

Examples of the conductive metal oxide may include indium tin oxide (ITO), indium zinc oxide (IZO), antimony zinc oxide (AZO), indium tin zinc oxide (ITZO), zinc oxide (ZnO), tin oxide (SnO2), and the like.

In one embodiment of the present disclosure, the first and second electrodes 220 and 230 may be formed of a single layer or multiple layers.

The first and second electrodes 220 and 230 may be formed of the same material or different materials.

Shapes of the first and second electrodes 220 and 230 are not limited to those shown in FIG. 3 and may be variously changed.

The first wires 227 may connect the first electrodes 220 and the pads 240. In addition, the second wires 237 may connect the second electrodes 230 and the pads 240. The first and second wires 227 and 237 may transmit signals output from the first and second electrodes 220 and 230 to the pads 240.

The pads 240 according to the present disclosure may be connected to a sensor controller (not shown) through an additional wire, a flexible printed circuit board, a tape carrier package, a connector, a chip-on film, or the like.

At least one of the first electrodes 220 and the second electrodes 230 may receive a driving signal from the sensor controller and at least one of the first electrodes 220 and the second electrodes 230 may output sensing signals to the sensor controller.

Accordingly, the sensor controller may detect a touch position by using the sensing signals.

Figure 4A:
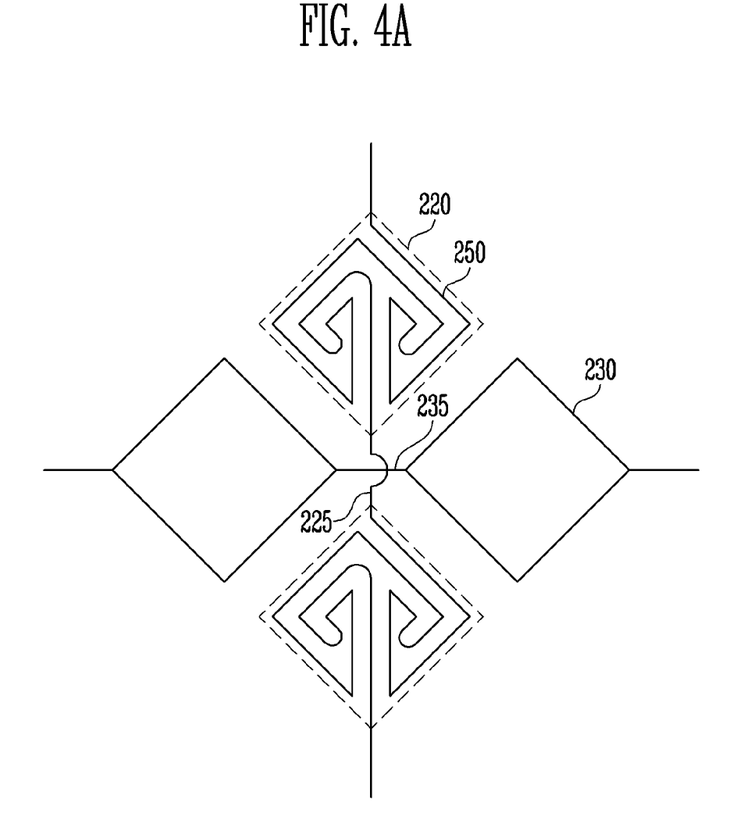
FIGS. 4A and 4B are enlarged views illustrating a portion of the first sensor shown in FIG. 3.
Figure 4B:
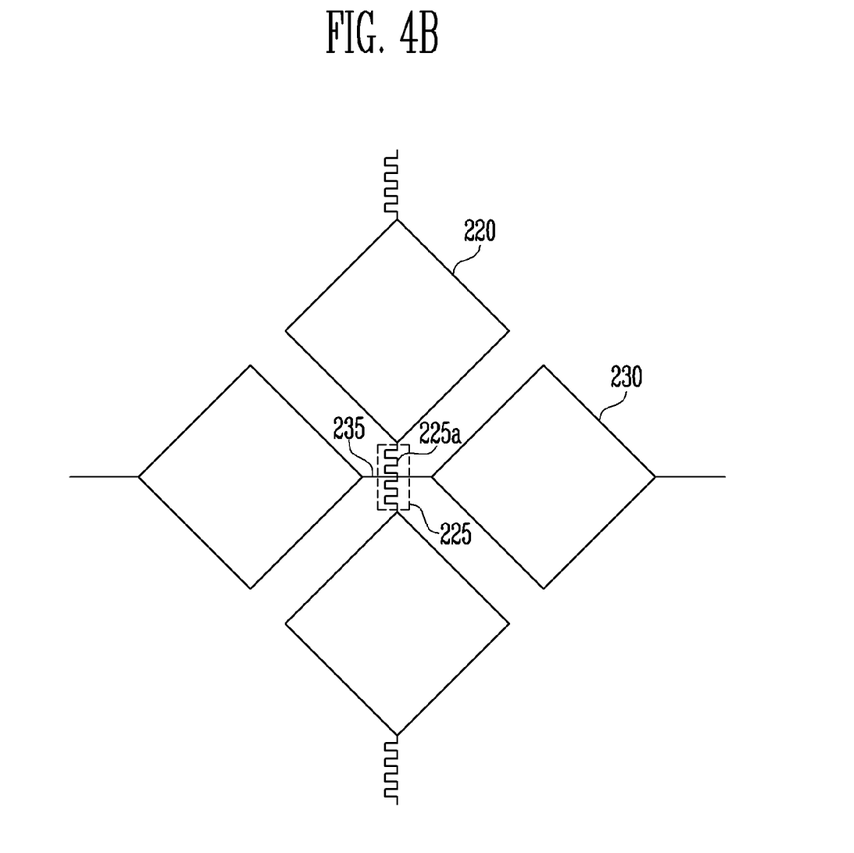

FIGS. 4A and 4B are enlarged views illustrating a portion of the first sensor shown in FIG. 3. For convenience of explanation, FIG. 4A illustrates an area where two first electrodes 220 and two second electrodes 230 are formed.

The first electrode 220 according to the present disclosure may include a resistive element 250, and the resistive element 250 may be curved to have a predetermined pattern.

When a force having a predetermined intensity is applied to the resistive element 250, a length or a cross-sectional area of the resistive element 250 may be changed.

Since a resistance value of the resistive element 250 is changed when the length or the cross-sectional area of the resistive element 250 is changed, the intensity of a pressure may be determined from the changed resistance value.

That is, according to the present disclosure, the first electrode 220 including the resistive element 250 may operate as a strain gauge.

Specifically, when a touch is input to the display device 1, the position of a touch may be detected through a variation in mutual-capacitance between the first and second electrodes 220 and 230, and the intensity of the touch may be detected from a resistance variation of the first electrode 220.

The physical properties (a length, a cross-sectional area, a resistance value, etc.) of the resistive element 250 may be changed according to a pressure applied thereto, and thus, the first electrodes 220 including the resistive elements 250 may operate as the strain gauge. In addition, the resistive element 250 may be in the form of a line, a thin film, or the like. In addition, the resistive element 250 may include a conductive material such as a metal.

The metal may be gold (Au), silver (Ag), aluminum (Al), molybdenum (Mo), chromium (Cr), titanium (Ti), nickel (Ni), neodymium (Nd), copper (Cu), platinum (Pt), and the like.

However, the material forming the resistive element 250 is not limited thereto. A material capable of forming a mutual-capacitance with an adjacent electrode and physically deformable by a pressure may be used for the resistive element 250 according to the present disclosure.

The resistive element 250 may be deformed by a touch input to the display device 1 and/or by bending the display device 1.

Specifically, when the display device 1 is bent, the resistive element 250 may be deformed by a tensile stress or a compressive stress in a bending area.

That is, when the display device 1 is bent, a sensing signal in which a resistance variation is reflected may be output from the first electrodes 220.

FIG. 4A shows that the first electrodes 220 include the resistive elements 250, but the present disclosure is not limited thereto. For example, the second electrodes 230 may include the resistive elements 250, and both the first electrodes 220 and the second electrodes 230 may include the resistive elements 250. Alternatively, only a portion of the first electrodes 220 may include the resistive elements 250.

Although not shown in FIG. 3, one end of each of the first electrodes 220 to which the first wires 227 are not connected and one end of each of the second electrodes 230 to which the second wires 237 are not connected may be connected to a reference power source (e.g., a ground voltage power source) so that a resistance of the resistive element may be measured.

FIG. 4B shows the shape of an electrode according to another embodiment of the present disclosure, and FIG. 4B is an enlarged view of a portion of the first sensor shown in FIG. 3. FIG. 4B illustrates an area where two first electrodes 220 and two second electrodes 230 are formed for convenience of explanation.

Referring to FIG. 4B, first connection units 225 connecting the first electrodes 220 may include resistive elements 225a formed in a zigzag pattern.

When a force having a predetermined intensity is applied to a resistive element 225a, a length or a cross-sectional area of the resistive element 225a may be changed.

When the length or the cross-sectional area of the resistive element 225a is changed, a resistance value thereof may be changed, and thus, the intensity of a pressure may be determined from the changed resistance value.

That is, according to the present disclosure, the first connection unit 225 including the resistive element 225a may operate as a strain gauge, and the first connection unit 225 may electrically connect the first electrodes 220 and function as a pressure sensor.

The resistive element 225a included in the first connection unit 225 may include the same material as the resistive element 250 shown in FIG. 4A.

When a touch is input to the display device 1, the position of the touch may be detected through a mutual-capacitance variation of the first and second electrodes 220 and 230, and the intensity of the touch may be detected from the resistance variation of the resistive element 225a.

In addition, the resistive element 225a may be deformed when the display device 1 is bent.

Specifically, when the display device 1 is bent, the resistive element 225a may be deformed by a tensile stress or a compressive stress in the bending area.

That is, when the display device 1 is bent, a sensing signal in which a resistance variation is reflected may be output from the first connection unit 225.

FIG. 4B shows that the first connection units 225 include the resistive elements 225a, but the present disclosure is not limited thereto. For example, the second connection units 235 may include the resistive elements 225a, and both the first connection units 225 and the second connection units 235 may include the resistive elements 225a. Alternatively, only a portion of the first connection units 225 may include the resistive element 225a.

The configurations of the second sensor 30 may be formed in the same shape and perform the same function as the embodiments of the first sensor 20 described with reference to FIGS. 3 to 4B. Therefore, a detailed description of the second sensor 30 will be omitted.

Figure 5:
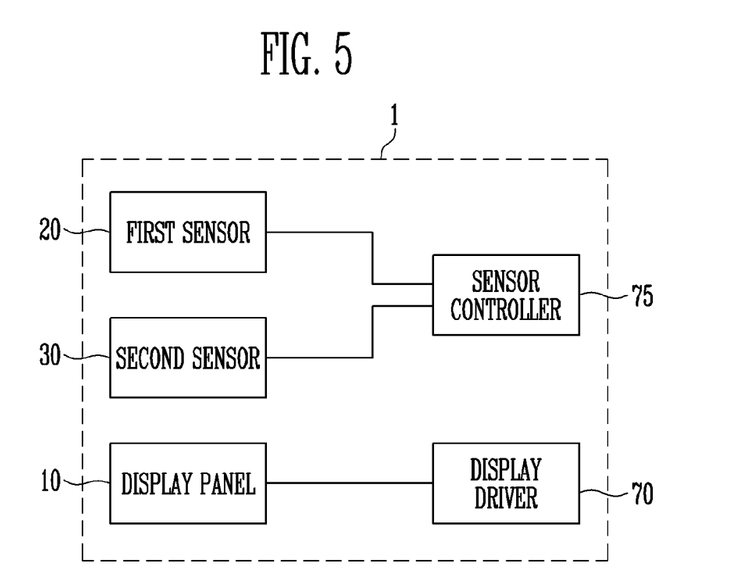
FIG. 5 is a view illustrating a display device including a display driver and a sensor controller according to an embodiment of the present disclosure.

FIG. 5 is a view illustrating a display device including a display driver and a sensor controller according to an embodiment of the present disclosure.

Referring to FIG. 5, the display device 1 according to an embodiment of the present disclosure may further include a display driver 70 and a sensor controller 75.

The display driver 70 may control an image display operation of the display panel 10 by supplying an image driving signal to the display panel 10.

The display driver 70 may generate the image driving signal by using image data and a control signal supplied externally.

For example, the display driver 70 may receive the image data and the control signal from a host (not shown), and the control signal may include a vertical synchronization signal, a horizontal synchronization signal, a main clock signal, and the like.

In addition, the image driving signal may include a scan signal, a data signal generated by using the image data, and the like.

The sensor controller 75 may obtain a sensing signal output from the first sensor 20 and a sensing signal output from the second sensor 30.

The sensor controller 75 may be connected to the first sensor 20 and the second sensor 30, and more specifically, connected to electrodes included in the first sensor 20 and the second sensor 30.

The sensor controller 75 may detect the position and intensity of the touch applied to the window 50 by detecting a capacitance variation and a resistance variation reflected in the sensing signal output from the first sensor 20.

The sensor controller 75 may detect the position and intensity of the touch applied to the lower protective layer 60 by detecting a capacitance variation and a resistance variation reflected in the sensing signal output from the second sensor 30.

The sensor controller 75 may not detect the position and intensity of the touch from the sensing signal of the second sensor 30 when detecting the position and intensity of the touch from the sensing signal of the first sensor 20.

In addition, the sensor controller 75 may also detect the bending direction of the display device 1 by detecting both the resistance variation reflected in the sensing signal of the first sensor 20 and the resistance variation reflected in the sensing signal of the second sensor 30.

The sensor controller 75 may detect a deformation rate of the display device 1, which indicates an extent to which the display device 1 is bent (for example, a bending angle) by using a level of a resistance variation.

The display device 1 according to an embodiment of the present disclosure may further include a memory (not shown) storing a bending angle value corresponding to the level of the resistance variation. The memory may be included in the sensor controller 75 or formed separately from the sensor controller 75.

The display driver 70 and the sensor controller 75 may be integrated into one configuration. For example, the display driver 70 and the sensor controller 75 may be embodied as an integrated circuit (IC).

Figure 6A:
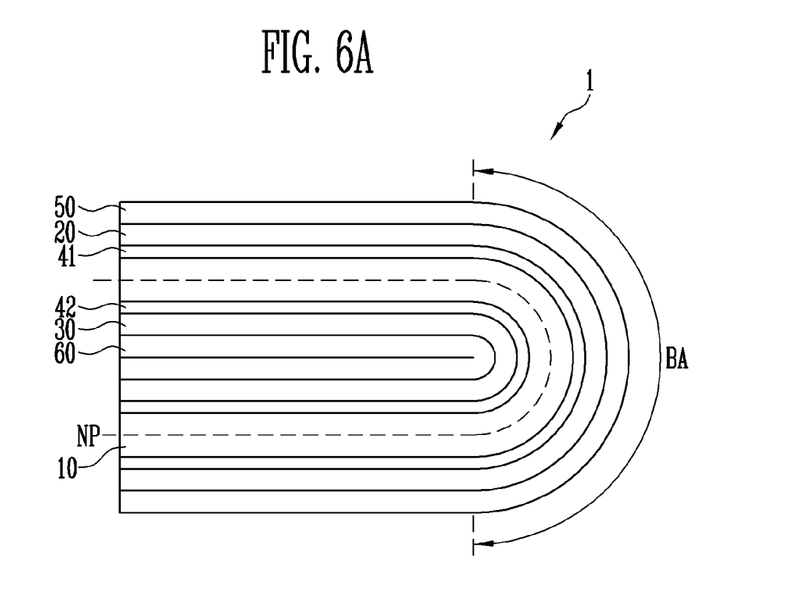
FIGS. 6A and 6B are exemplary views illustrating a bending display device according to an embodiment of the present disclosure.
Figure 6B:
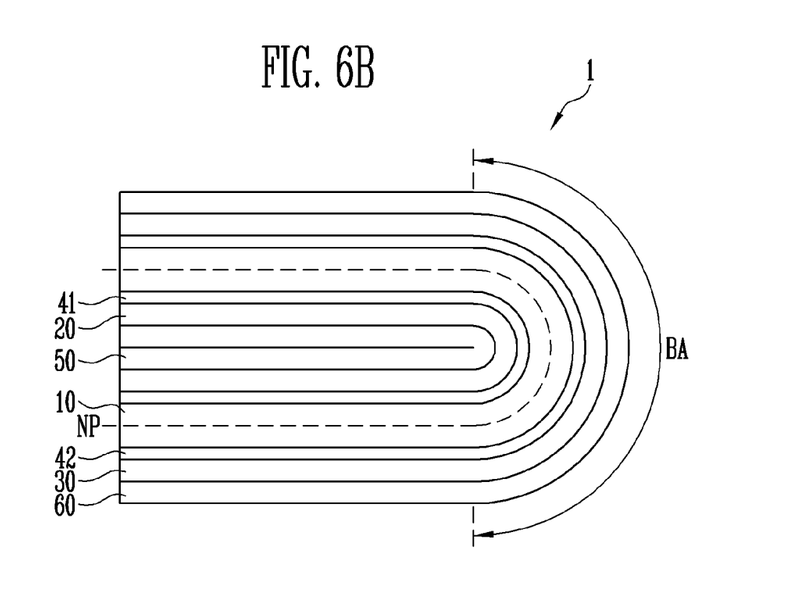

FIGS. 6A and 6B are exemplary views illustrating a display device that is bent according to an embodiment of the present disclosure. Specifically, FIG. 6A shows that the window 50 is outwardly bent, and FIG. 6B shows that the lower protective layer 60 is outwardly bent.

When the display device 1 is bent, the respective components may be deformed in a bending area BA. For example, the respective components may be stretched or compressed.

When the display device 1 is bent, a neutral plane NP having a minimum deformation rate may exist in the bending area BA.

According to an embodiment of the present disclosure, the neutral plane NP may be disposed in the display panel 10, and the neutral plane NP may be interposed between the first sensor 20 and the second sensor 30.

As shown in FIG. 6A, when the window 50 is outwardly bent, the constituents located outside the neutral plane NP (closer to the window 50) may receive a tensile stress, and the constituents located inside the neutral plane NP (closer to the lower protective layer 60) may receive a compressive stress.

That is, since the first sensor 20 receives a tensile stress in the bending area BA, the resistive element located in the bending area BA may be stretched. Thus, a resistance value of the resistive element may be increased.

On the contrary, since the second sensor 30 receives a compressive stress in the bending area BA, the resistive element located in the bending area BA may be compressed. Thus, the resistance value of the resistive element may be reduced.

As shown in FIG. 6B, when the window 50 is inwardly bent, the constituents located outside the neutral plane NP (closer to the lower protective layer 60) may receive a tensile stress, and the constituents located inside the neutral plane NP (closer to window 50) may receive a compressive stress.

That is, since the first sensor 20 receives a compressive stress in the bending area BA, the resistive element located in the bending area BA may be compressed. Thus, the resistance value of the resistive element may be reduced.

On the contrary, since the second sensor 30 receives a tensile stress in the bending area BA, the resistive element located in the bending area BA may be stretched. Thus, the resistance value of the resistive element may be increased.

Accordingly, the sensor controller 75 may determine that the window 50 is outwardly bent when a signal in which a resistance variation having a positive value is reflected is output from the first sensor 20, and a signal in which a resistance variation having a negative value is reflected is output from the second sensor 30.

Alternatively, the sensor controller 75 may determine that the window 50 is inwardly bent when a signal in which the resistance variation having a negative value is reflected is output from the first sensor 20, and a signal in which the resistance variation having a positive value is reflected is output from the second sensor 30.

That is, the sensor controller 75 may sense the bending direction of the display device with reference to both the signals output from the first sensor 20 and the second sensor 30.

According to the bending angle of the display device 1, a tensile stress (or a compressive stress) applied to each of the components in the bending area BA may vary. Accordingly, a resistance variation reflected in the output signal of the first sensor 20 and a resistance variation reflected in the output signal of the second sensor 30 may be changed according to the bending angle of the display device 1.

Therefore, the sensor controller 75 may detect the bending angle of the display device 1 by using values of the resistance variations.

The bending direction and the bending angle of display device 1 may be detected to accurately display user interface (UI) or provide user experience (UX) when the display device 1 is bent.

According to an embodiment of the present disclosure, since the bending direction, the bending angle, and the like of the display device 1 are detected by using the first sensor (and/or the second sensor), which also detects the position and intensity of the touch, an additional sensor for detecting the bending direction and the bending angle of the display device 1 may not be required.

Further, when the display device 1 is bent, a variation caused by a compressive stress may be very small as compared to a variation caused by a tensile stress. Therefore, a rate of error occurrence may be large when the bending direction, the bending angle, and the like of the display device 1 are detected only by the variation caused by the compressive stress.

According to an embodiment of the present disclosure, the neutral plane NP may be interposed between the first sensor 20 and the second sensor 30. Thus, a tensile stress may be detected by the first sensor 20 or the second sensor 30 regardless of the direction in which the display device 1 is bent. Thus, accuracy of detecting the bending direction and the bending angle may be improved.

Figure 7A:
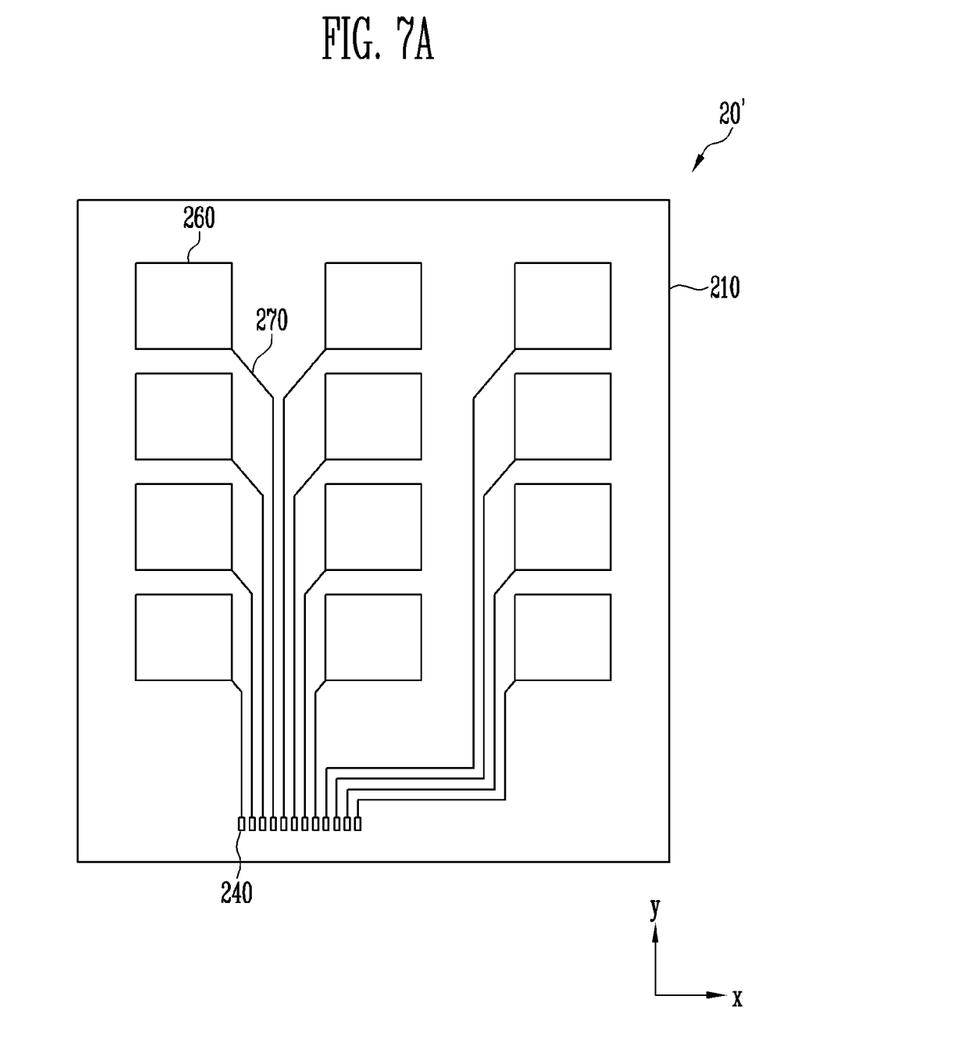
FIG. 7A is a plan view illustrating a first sensor according to another embodiment.
Figure 7B:
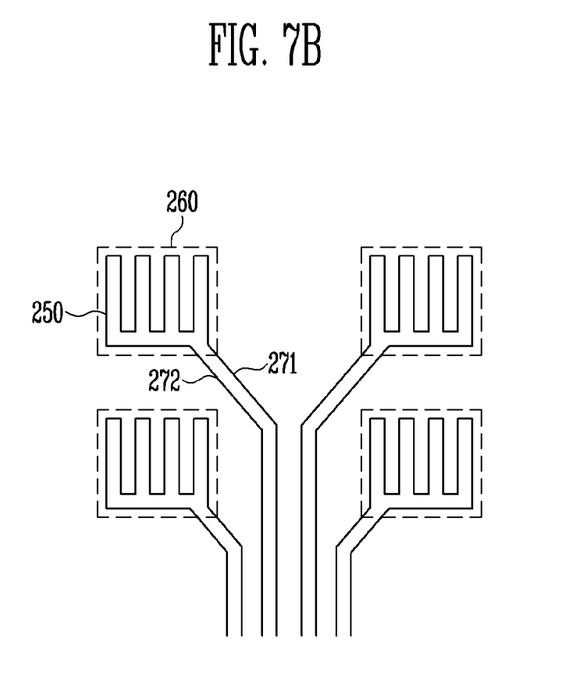
FIG. 7B is an enlarged view illustrating a portion of the first sensor shown in FIG. 7A.

FIG. 7A is a plan view illustrating a first sensor according to another embodiment, and FIG. 7B is an enlarged view illustrating a portion of the first sensor shown in FIG. 7A.

Referring to FIG. 7A, a first sensor 20' according to another embodiment of the present disclosure may include the substrate 210, a plurality of electrodes 260, a plurality of wires 270, and the plurality of pads 240.

First, since the substrate 210 is embodied as the substrate 210 shown in FIG. 3, the same reference numeral is given to the substrate 210, and a detailed description of the substrate 210 will be omitted.

The plurality of electrodes 260 may be disposed on the substrate 210. More specifically, the plurality of electrodes 260 may be arranged in a matrix in which the plurality of electrodes 260 are arranged along an x-axis direction, and a plurality of electrode rows arranged along the x-axis direction are arranged along a y-axis direction.

The plurality of electrodes 260 according to an embodiment of the present disclosure may be used for sensing a touch using a capacitance variation, and more specifically, for sensing a self-capacitance.

The plurality of electrodes 260 may be formed of the same material as the first electrodes 220 or the second electrodes 230 shown in FIGS. 3 to 4B.

FIG. 7A shows that each of the electrodes 260 has a square shape. However, the present disclosure is not limited thereto, and the shape of the electrodes 260 may be variously changed. The number of electrodes 260 provided on the substrate 210 may also vary.

The plurality of wires 270 may be connected between the plurality of electrodes 260 and the plurality of pads 240. Specifically, each of the wires 270 may extend from the corresponding electrode 260 along the y-axis direction to be electrically connected to the pads 240.

The plurality of wires 270 may transmit signals output from the plurality of electrodes 260 to the plurality of pads 240. The signals may include a signal corresponding to capacitance variations of the electrodes and a deformation rate of a resistive element to be described below.

In FIG. 7A, the plurality of electrodes 260 and the plurality of wires 270 may be formed on the same layer, but the present disclosure is not limited thereto. For example, the plurality of electrodes 260 and the plurality of wires 270 may be formed on different layers, and the plurality of electrodes 260 and the plurality of wires 270 may be electrically connected through a contact hole.

Since the pads 240 according to the present disclosure may be embodied as the pads 240 shown in FIG. 3, the same reference numeral is given to the pads 240, and a detailed description of the pads 240 will be omitted.

When a touch is input to the display device 1, self-capacitances of the electrodes 260 associated with the touch are changed, and the sensor controller 75 may use the signals output from the electrodes 260 to detect a touch position.

Referring to FIG. 7B, the electrode 260 according to an embodiment of the present disclosure may include the resistive element 250, and the resistive element 250 may be at least partially curved, for example, may have a zigzag shape.

In addition, a wire may include a first wire 271 and a second wire 272 in order to obtain the resistance of the resistive element.

The resistive element 250 may be embodied as the resistive element 250 shown in FIG. 4A. Thus, the same reference numerals are given.

That is, when a touch is input to the display device 1, the position of a touch may be obtained through self-capacitance variations of the electrodes 260. As the resistive element 250 operates as a strain gauge, the intensity of the touch may be obtained from the resistance variation of the resistive element 250.

The resistive element 250 may be deformed by the touch input to the display device 1 and/or by bending the display device 1.

Specifically, when the display device 1 is bent, the resistive element 250 may be deformed by a tensile stress or a compressive stress in the bending area.

That is, when the display device 1 is bent, the sensing signal in which the resistance variation is reflected may be output from the electrodes 260.

FIG. 7B shows that each of the electrodes 260 may include the resistive element 250, but the present disclosure is not limited thereto. For example, the resistive element 250 may be included in only a part or a subset of the electrodes 260.

The resistive element 250 may be included in the wire 270 connected to the electrode 260 in addition to the electrode 260.

According to the present disclosure, a display device including a touch sensor for detecting a touch position, an intensity of a touch, and a bending direction and a bending angle of the display device may be provided.

Embodiments are provided to illustrate the concepts of the disclosure. However, it should be understood that the disclosure is not limited to the specific embodiments thereof. Accordingly, it will be understood by those of skill in the art that various changes in form and details may be made without departing from the spirit and scope of the present disclosure as set forth in the following claims.

Therefore, the technical scope of the present disclosure should not be limited to the contents described in the detailed description of the specification and should be defined by the claims.

What is claimed is:

1. A display device, comprising:
a display panel configured to be bent or unbent;
a first sensor disposed on a first surface of the display panel and configured to sense a touch; and
a second sensor disposed on a second surface of the display panel and configured to sense a touch,
wherein each of the first sensor and the second sensor comprises a resistive element configured to sense a bending direction and a deformation rate of the display device,
wherein, in a bending area of the display device, when a compressive stress is applied to the second sensor and a tensile stress is applied to the first sensor, the bending direction is determined as a first direction, and
wherein when a tensile stress is applied to the second sensor and a compressive stress is applied to the first sensor, the bending direction is determined as a second direction which is an opposite direction of the first direction.

2. The display device of claim 1, wherein the display panel includes a neutral plane having a minimum deformation rate in the bending area when the display device is bent.

3. The display device of claim 2, wherein the neutral plane is interposed between the first sensor and the second sensor.

4. The display device of claim 1, wherein each of the first sensor and the second sensor includes a plurality of electrodes for sensing the touch by using a variation of capacitance.

5. The display device of claim 4, wherein at least one of the plurality of electrodes includes the resistive element that is at least partially bent.

6. The display device of claim 5, wherein a resistance of the resistive element is changed in response to a pressure of the touch or bending of the display device.

7. The display device of claim 6, wherein the bending direction and the deformation rate of the display device is detected with reference to a resistance variation of the resistive element reflected in an output signal of the first sensor and a resistance variation of the resistive element reflected in an output signal of the second sensor.

8. The display device of claim 7, wherein the bending direction of the display device is detected by determining whether or not the resistance variations reflected in the output signals of the first sensor and the second sensor are caused by the tensile stress or the compressive stress.

9. The display device of claim 7, wherein the deformation rate is detected with reference to a level of the resistance variation.

10. The display device of claim 6, wherein a position of the touch is detected from a capacitance variation reflected in an output signal of the first sensor or the second sensor, and a pressure of the touch is detected from a resistance variation of the resistive element reflected in the output signal of the first sensor or the second sensor.

11. The display device of claim 1, wherein each of the first sensor and the second sensor comprises:
  a plurality of first electrodes arranged in the first direction;
  a plurality of second electrodes arranged in the second direction different from the first direction and configured to form a mutual-capacitance with an adjacent first electrode;
  a plurality of first connection units connecting the plurality of first electrodes to one another; and
  a plurality of second connection units connecting the plurality of second electrodes to one another.

12. The display device of claim 11, wherein at least one of the plurality of first connection units or the plurality of second connection units includes the resistive element having a zig-zag pattern.

13. The display device of claim 11, wherein the at least one of the plurality of first connection units or the plurality of second connection units includes the resistive element that is at least partially bent.

14. The display device of claim 1, further comprising:
  a first adhesive layer disposed between the first sensor and the display panel; and
  a second adhesive layer disposed between the display panel and the second sensor.

15. The display device of claim 1, further comprising a window disposed above the first sensor.

16. The display device of claim 1, further comprising a lower protective layer disposed under the second sensor.

* * * * *